United States Patent [19]

Jain et al.

[11] Patent Number: 4,800,170

[45] Date of Patent: Jan. 24, 1989

[54] PROCESS FOR FORMING IN A SILICON OXIDE LAYER A PORTION WITH VERTICAL SIDE WALLS

[75] Inventors: Kailash C. Jain, Sterling Heights; Bernard A. MacIver, Lathrup Village, both of Mich.

[73] Assignee: General Motors Corporation, Detroit, Mich.

[21] Appl. No.: 104,091

[22] Filed: Oct. 2, 1987

[51] Int. Cl.$^4$ .................. H01L 21/425; H01L 21/467
[52] U.S. Cl. ........................................ 437/24; 437/26; 437/228; 156/643; 156/653
[58] Field of Search ................ 156/643, 646, 649, 651, 156/653, 662; 437/24, 26, 61, 228, 947, 981; 148/DIG. 161

[56] References Cited

U.S. PATENT DOCUMENTS

| 3,816,194 | 6/1974 | Kroger et al. | 156/649 |
|---|---|---|---|
| 4,088,799 | 5/1978 | Kurtin | 427/38 |
| 4,456,901 | 6/1984 | Kurtz et al. | 357/26 |
| 4,457,820 | 7/1984 | Bergeron et al. | 156/643 X |
| 4,508,591 | 4/1985 | Bartlett et al. | 156/653 X |

FOREIGN PATENT DOCUMENTS 0199223  12/1982  Japan .................................. 156/651

OTHER PUBLICATIONS

Cellar, G. K. and Robinson, McD., "Seeded Recrystallization of Thick Polysilicon Films on Oxidized 3-in. Wafers," Applied Physics Letters, vol. 42, No. 1, Jan. 1983, pp. 99–101.

Jastrzebski, L., "Comparison of Different SOI Technologies", RCA Review, vol. 44, Jun. 1983, pp. 250–268.

Tuppen, G. C.; Taylor, M. R.; Hemment, P. L. F.; Arrowsmith, R. P., "Effect of Implantation Temperature on the Properties of Buried Oxide Layers in Silicon formed by Oxygen Ion Implantation," Applied Physics Letters, vol. 45, No. 1, Jul. 1984, pp. 57–59.

Primary Examiner—Olik Chaudhuri
Attorney, Agent, or Firm—Robert J. Wallace

[57] ABSTRACT

A process for forming a buried patterned silicon oxide layer in a silicon chip in which the layer is formed by implanting oxygen into the chip through a mask of silicon oxide on the surface of the silicon chip. The silicon oxide mask is formed to have essentially vertical side walls by interposing an irradiation step between a pair of isotropic wet etching steps in its formation.

11 Claims, 1 Drawing Sheet

PROCESS FOR FORMING IN A SILICON OXIDE LAYER A PORTION WITH VERTICAL SIDE WALLS

FIELD OF THE INVENTION

This invention relates to semiconductor device processing, and more particularly to patterning a silicon oxide layer.

BACKGROUND OF THE INVENTION

Silicon oxide has been a material of great utility in the technology of silicon devices. In many of its uses in this technology, there is a need for patterning the silicon oxide, and more particularly to providing in a silicon oxide layer openings with essentially vertical side walls.

Presently, the standard technique for forming such openings involves providing over the oxide layer a mask having a pattern of openings matching that desired for the oxide layer openings and then etching the exposed portions of the layer anisotropically by reactive ion etching (RIE). This process requires expensive equipment with low throughput so that it becomes slow and costly.

It is desirable to form openings in a silicon oxide layer without the need for expensive equipment that has a low throughput.

It is known to use wet etchants to pattern layers in silicon oxide but generally such etching is isotropic and this gives rise to undercutting of the mask used to define the pattern. As a result, the side walls of the openings formed are sloped.

Moreover, while some crystalline materials can be etched along selected crystal planes to provide anisotropy, this is not usually possible because of the generally amorphous nature of the silicon oxide layers used in silicon device technology.

It has also long been known that regions of most materials damaged by irradiation by high energy particles can be etched faster than undamaged regions but this approach has not been used to any significant extent in the processing of silicon devices.

SUMMARY OF THE INVENTION

The present invention uses wet etching to permit high throughput. It interposes an irradiation step between two wet etch steps to introduce anisotropy in an otherwise isotropic process for forming substantially vertical side walls in openings etched in a silicon oxide layer.

The invention will be described specifically with reference to its use in the formation of a patterned buried silicon oxide layer in a silicon crystal. A silicon crystal with a buried oxide layer has a variety of uses of which one is in the formation of JMOS transistors of the kind described in U.S. Pat. No. 4,611,220, issued on Sept. 6, 1986.

To provide such a buried oxide layer, there is first prepared a single crystal silicon wafer, over one surface of which is grown thermally a layer of silicon oxide. Next by the usual photolithographic techniques an etch-resistant mask is formed over the silicon oxide layer patterned in the manner desired for the openings to be formed in the oxide layer. The exposed silicon oxide is then etched in a wet etchant, for example buffered hydrofluoric acid. Typically about two thirds of the thickness of the layer is removed. This isotropic wet etching does provide some lateral etching resulting in sloped regions in this layer at the edges of the mask.

The silicon wafer is then irradiated with non-contaminating high energy particles, such as silicon or argon ions accelerated by voltages of about 150 thousand electron volts. This irradiation results in an implantation that selectively damages the oxide layer. Additionally, as a result of the implantation, the undercut mask tends to yield a bit. As a result, when the wafer is again subjected to a wet etchant, also typically buffered hydrofluoric acid, to remove the remaining thickness of the oxide layer where completely exposed by the mask, there results a pattern of openings with nearly vertical side walls.

Thereafter this patterned surface silicon oxide is used as a mask for oxygen implantation into the silicon wafer, for forming the desired buried oxide layer in the silicon wafer. During such implantation it is found advantageous to flood the silicon wafer with electrons to mitigate the charge buildup on the silicon oxide mask.

The invention will be better understood from the following more detailed description taken with the accompanying drawing.

It is to be noted that the drawings are not to scale since the vertical dimensions generally are much smaller than the horizontal dimensions.

DETAILED DESCRIPTION OF THE INVENTION

Figure 1:
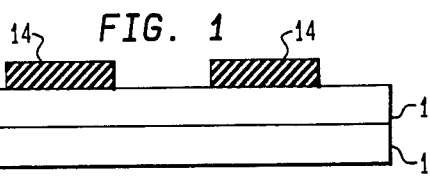
FIGS. 1 through 7 depict a silicon wafer at various stages of processing to introduce a patterned silicon oxide layer in its interior using a mask formed in accordance with the invention.

Referring now to FIG. 1, there is shown a single crystal silicon wafer 10 in which it is desired to form a patterned buried insulating layer, typically silicon dioxide, for use in fabricating JMOS transistors of the kind described in the aforementioned patent. For this purpose it has been found desirable to use a (100) silicon crystal into which oxygen is implanted for forming the buried oxide layer. It is first necessary to form over the surface of the wafer a suitable mask for controlling the implantation of the oxygen into the wafer. A suitable mask for this purpose is a silicon oxide layer appropriately patterned, preferably with openings having substantially vertical side walls.

To provide such a mask, a suitable layer of silicon oxide 12 is first formed over the silicon wafer. This layer, typically about one micron thick, can be readily formed by thermal oxidation in known fashion. While not necessary, it is found advantageous to anneal this thermal oxide layer by heating in nitrogen at about 1000 degrees C. for about one hour before further processing. Alternatively, a suitable oxide layer can be formed by chemical vapor deposition in known fashion.

Next, in the usual manner of forming a mask by photolithography, a layer of photoresist is deposited over the oxide layer and then patterned to leave a mask 14 of the photoresist material over the silicon oxide layer. The resultant at this stage is shown in FIG. 1.

Figure 2:
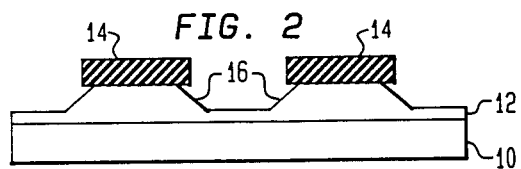

The masked wafer is then treated in a buffered hydrofluoric acid solution for a time adequate to remove about two thirds of the thickness of the silicon oxide layer where it is exposed at openings in the photoresist mask. Typically, this will take between five and six minutes for an oxide layer of the kind described. The resultant is shown on FIG. 2. As shown, there will be some undercutting of the mask because of the isotropic nature of the etching to leave sloped regions 16 in the oxide layer 12 at the edges of the photoresistant mask 14.

The wafer is then rinsed, typically in deionized water, and then dried in the usual fashion.

Figure 3:
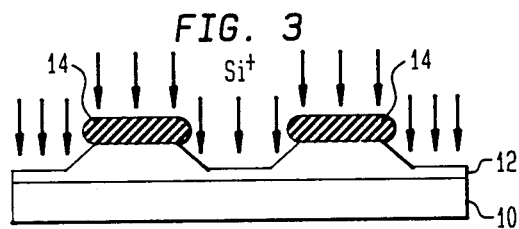

Next the wafer is subjected to blanket irradiation with silicon ions, typically at an accelerating voltage of about 150 KeV, as illustrated schematically in FIG. 3. A typically dosage is 5 times 10 to the fourteenth ions per square centimeter. This step is used primarily to damage portions of the oxide layer to facilitate their removal. The regions of the layer not masked will experience the greatest damage. Moreover, portions of the sloped regions 16 further form the edge of the mask 14 will experience greater damage than portions closer to the edge. Additionally, it is found that because of ion impact the edges of the mask where the underlying oxide layer had previously been undercut will yield a bit, enhancing the exposure of the sloped regions furthest from the edge of the mask.

Figure 4:
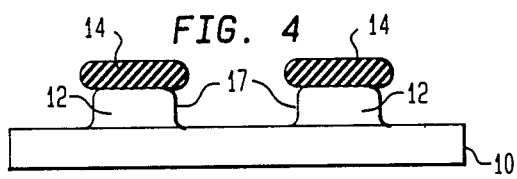

The silicon wafer is then exposed again to a suitable wet etchant, for example buffered HF, until the exposed silicon oxide layer is removed, including most of the sloped region 16 earlier formed, leaving only a limited top portion that is well shielded by the photoresist mask. Immersion in the etchant for several minutes typically is adequate. The resultant is shown in FIG. 4 where the profiles of the side walls 17 of the openings formed in th oxide layer are seen to be substantially vertical, the lateral effect of the initial etching step being substantially nullified by this subsequent etching step.

Figure 5:
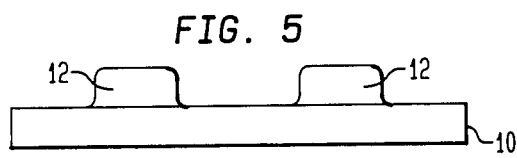

The photoresist mask is then removed, leaving only the patterned oxide layer 12 over the silicon wafer 10, as seen in FIG. 5.

Such an oxide layer has a wide variety of uses. For example, it can be used either as an implantation mask, a vapor-diffusion mask, or as an insulator for an overlying conductor layer that makes contact with the silicon wafer at the openings formed in the oxide layer.

As mentioned earlier, an apertured oxide layer, prepared as described above, is especially useful as an oxygen-implantation mask for forming a buried oxide layer in the silicon wafer, the process being described.

It has been found useful before proceeding with the oxygen implantation to heat the wafer at about 1200 degrees C. in nitrogen for about an hour. This eliminates any cracks in the surface of the silicon layer resulting from stress caused by the earlier processing. Alternatively, any cracking can be eliminated by heating in steam or oxygen at about 1100 degrees C.

Figure 6:
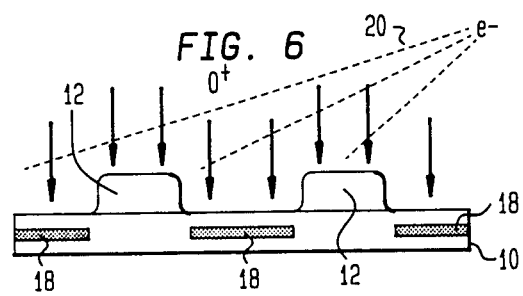

After such surface conditioning, the oxygen is implanted, as indicated in FIG. 6, to form oxygen-rich region 18, shown stippled, in the interim of the wafer 10. Typically, the oxygen ions are implanted with energies in the 100 KeV-200 KeV range and dosages in the 1.5 times 10 to the eighteenth -2.4 times 10 to the eighteenth ions per square centimeter range while the wafer is maintained in the 500 degrees C.-600 degrees C. temperature range.

To avoid ion deflection by positive charge buildup in the silicon oxide mask, it is found desirable to flood the silicon wafer with electrons during the implantation. Any suitable means can be used for providing the electrons. In FIG. 6 the electron flooding is represented schematically by the broken lines 20.

After implantation of the oxygen, the masking oxide layer is stripped away and the surface cleaned to remove any surface contaminants. To undo any implantation damage to the silicon surface and to transform the oxygen-rich regions into a stoichiometric buried silicon dioxide layer, the wafer is then heated, typically to about 1150 degrees C. for two hours in dry hydrogen. Alternatively an even higher temperature of at least 1250 degrees C. may be used with an appropriate capping layer for such purpose.

Figure 7:
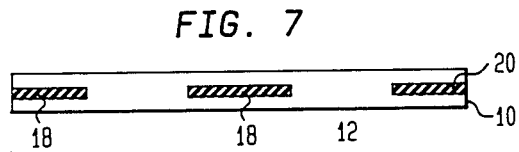

The resultant in FIG. 7 will be silicon dioxide regions 20 between about 0.3 and 0.4 micron thick buried about 0.1 micron under the surface of silicon wafer 10. The silicon dioxide regions 20 typically are about 17 microns wide with a spacing of about 3 microns between regions. If a thicker layer is desired, one may grow additional silicon epitaxially over this layer.

As indicated previously, silicon oxide has proven particularly advantageous as a mask for the oxygen implantation. The silicon oxide is non-contaminating and its technology is well established. In practice the need for a flooding electron beam is not a serious disadvantage because it proves desirable to use a flooding electron beam even if a conductor, such as a refractive metal, is used to mask the oxygen implantation. This is because of the tendency for an insulating oxide to form on such a mask that also otherwise gives rise to charge buildup.

It should be appreciated that various modifications may be made in the process described without departing form the spirit and scope of the invention. In particular, the various temperatures, dimensions, high energy particles and etchants mentioned are merely illustrative.

Moreover, as previously mentioned, a silicon oxide formed as described should have a variety of other applications. Moreover, as an implantation mask, it can be used alternatively to control the implantation of nitride into silicon to form a buried silicon nitride layer in the manner analogous to the buried silicon oxide layer described.

Moreover, while a silicon wafer is expected to be the usual substrate in the practice of the invention, other substances might be used.

The embodiments of the invention in which an exclusive property or privilege is claimed are defined as follows:

1. A process of forming over a substrate a silicon oxide layer having a pattern of openings with substantially vertical side walls comprising the steps of:
   forming a layer of silicon oxide over a surface of the substrate;
   forming a mask over the silicon oxide layer leaving exposed the pattern desired in the silicon oxide layer;
   partially removing by a wet etchant the silicon oxide exposed in the pattern, leaving sloped regions in the silicon oxide layer where it underlies the edges of the mask;
   irradiating the substrate with high energy particles to damage selectively the silicon oxide layer; and
   removing by a wet etchant the remainder of the exposed silicon oxide to form in the silicon oxide layer the desired pattern of openings with substantially vertical side walls.

2. The process of claim 1 in which the partial removal step removes about two thirds of the thickness of the exposed silicon oxide layer.

3. The process of claim 2 in which the partial removal step involves etching in buffered hydrofluoric acid.

4. The process of claim 1 in which silicon ions are the high energy particles used to irradiate the substrate.

5. The process of claim 2 in which the substrate is monocrystalline silicon.

6. The process of claim 5 in which silicon ions are the high energy particles used to irradiate the silicon substrate.

7. The process of forming a patterned insulated layer buried in a silicon crystal substrate comprising the steps of:
  forming a layer of silicon oxide over a surface of the substrate;
  forming a mask over the silicon oxide layer leaving exposed the pattern desired in the silicon oxide layer;
  partially removing by a wet etchant the silicon oxide exposed in the pattern, leaving sloped regions in the silicon oxide layer where it underlies the edges of the mask;
  irradiating the substrate with high energy particles to damage selectively the silicon oxide layer;
  removing by a wet etchant the remainder of the exposed silicon oxide to form in the silicon oxide layer the desired pattern of openings with substantially vertical side walls;
  implanting ions through the patterned silicon oxide layer for forming a buried ion-rich layer in the silicon substrate; and
  heating the substrate for converting the ion-rich layer into a buried insulating layer.

8. The process of claim 7 in which the silicon substrate is flooded with electrons during the ion implantation step.

9. The process of claim 8 in which the ions implanted are oxygen ions and the buried insulating layer formed is an oxide layer.

10. The process of claim 8 in which the ions implanted are nitrogen ions and the buried insulating layer is a nitride layer.

11. The process of forming a patterned silicon oxide layer in a silicon crystal substrate comprising the steps of:
  forming a layer of silicon oxide over a surface of the substrate;
  forming a mask over the silicon oxide layer, leaving exposed a pattern in the silicon oxide layer;
  partially removing by a wet etchant the silicon oxide exposed in the pattern, leaving sloped regions in the silicon oxide layer where it underlies the edges of the mask;
  irradiating the substrate with high energy silicon ions to damage the silicon oxide layer;
  removing by a wet etchant the remainder of the exposed silicon oxide to form in the silicon oxide layer the desired pattern of openings with substantially vertical walls;
  implanting oxygen ions through the patterned silicon oxide layer for forming an oxygen-rich layer several tenths of a micron thick and about a tenth of a micron from the surface in the silicon substrate, while flooding the substrate with electrons; and
  heating the substrate for converting the oxygen-rich layer into a buried silicon-oxide layer.

* * * * *